United States Patent
Aoi et al.

(10) Patent No.: US 9,983,237 B2
(45) Date of Patent: May 29, 2018

(54) LIGHTNING CURRENT MEASURING DEVICE AND LIGHTNING CURRENT MEASURING METHOD

(71) Applicant: MITSUBISHI HEAVY INDUSTRIES, LTD., Tokyo (JP)

(72) Inventors: Tatsufumi Aoi, Tokyo (JP); Yoichiro Tsumura, Tokyo (JP); Kiyoshi Kurosawa, Tokyo (JP); Yutaka Kikuchihara, Kanagawa (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 54 days.

(21) Appl. No.: 14/776,955

(22) PCT Filed: Mar. 24, 2014

(86) PCT No.: PCT/JP2014/058130
§ 371 (c)(1),
(2) Date: Sep. 15, 2015

(87) PCT Pub. No.: WO2014/157110
PCT Pub. Date: Oct. 2, 2014

(65) Prior Publication Data
US 2016/0041205 A1    Feb. 11, 2016

(30) Foreign Application Priority Data
Mar. 26, 2013    (JP) ................. 2013-064369

(51) Int. Cl.
*G01R 15/24* (2006.01)
*G01R 29/08* (2006.01)

(52) U.S. Cl.
CPC ....... *G01R 15/246* (2013.01); *G01R 29/0842* (2013.01)

(58) Field of Classification Search
CPC ................. G01R 15/246; G01R 29/0842
(Continued)

(56) References Cited

U.S. PATENT DOCUMENTS

| 4,564,754 A | 1/1986 | Sato et al. |
| 4,707,147 A | 11/1987 | Aoki et al. |

(Continued)

FOREIGN PATENT DOCUMENTS

| EP | 0088419 A1 | 9/1983 |
| EP | 1083650 A2 | 3/2001 |

(Continued)

OTHER PUBLICATIONS

PCT/IB/304, "Notification Concerning Submission, Obtention or Transmittal of Priority Document for International Application No. PCT/JP2014/058130," dated May 22, 2014.
(Continued)

*Primary Examiner* — Jeff Natalini
(74) *Attorney, Agent, or Firm* — Manabu Kanesaka; Benjamin Hauptman; Kenneth Berner (57) ABSTRACT

A lightning current measuring device is provided with: a polarized light separation element which separates light output from a sensor fiber into horizontal and vertical components having orthogonal planes of polarization, a Faraday rotation angle calculation unit calculating a Faraday rotation angle through arc-sine processing of a digitized signal of the difference between the horizontal and vertical components converted to a signal through photoelectric conversion after separation by the polarized light separation element, amplifiers which amplify the horizontal and vertical components converted to a signal through photoelectric conversion after separation by the polarized light separation element, a Faraday rotation angle calculating unit which calculates a Faraday rotation angle based on a digitized (Continued)

signal of the difference between the amplified horizontal and vertical components, and current value conversion units converting current values based on the calculated Faraday rotation angles.

4 Claims, 7 Drawing Sheets

(58) Field of Classification Search
USPC .................................................. 324/96, 72
See application file for complete search history.

(56) References Cited

U.S. PATENT DOCUMENTS

| | | | |
|---|---|---|---|
| 5,237,265 | A | 8/1993 | Peier et al. |
| 5,656,934 | A * | 8/1997 | Bosselmann ........ G01R 15/246 324/117 R |
| 5,834,933 | A | 11/1998 | Meier |
| 5,844,410 | A * | 12/1998 | Ikuta .................. G01R 15/247 324/117 R |
| 6,185,508 | B1 * | 2/2001 | Van Doorn ........ G01R 21/1331 324/140 R |
| 6,392,583 | B1 | 5/2002 | Bosselmann et al. |
| 6,445,155 | B1 | 9/2002 | Williams et al. |
| 7,075,286 | B2 * | 7/2006 | Bohnert ............... G01R 15/247 250/227.19 |
| 7,786,719 | B2 | 8/2010 | Kurosawa et al. |
| 2004/0101228 | A1 | 5/2004 | Bohnert |
| 2007/0008530 | A1 | 1/2007 | Gibbs et al. |
| 2010/0194379 | A1 * | 8/2010 | Kurosawa ........... G01R 15/246 324/96 |
| 2010/0253320 | A1 | 10/2010 | Kurosawa |

FOREIGN PATENT DOCUMENTS

| | | |
|---|---|---|
| JP | S62-161059 A | 7/1987 |
| JP | H05-208764 A | 8/1993 |
| JP | H07-43392 A | 2/1995 |
| JP | H07-198756 A | 8/1995 |
| JP | H07-270505 A | 10/1995 |
| JP | H08-504951 A | 5/1996 |
| JP | H08-145899 A | 6/1996 |
| JP | H08-262065 A | 10/1996 |
| JP | H10-221379 A | 8/1998 |
| JP | H10-227814 A | 8/1998 |
| JP | 2829113 B2 | 11/1998 |
| JP | 2996775 B2 | 1/2000 |
| JP | 3130582 B2 | 1/2001 |
| JP | 2002-116052 A | 4/2002 |
| JP | 2003-014790 A | 1/2003 |
| JP | 2004-503751 A | 2/2004 |
| JP | 2004-069710 A | 3/2004 |
| JP | 2006-078344 A | 3/2006 |
| JP | 2009-122095 A | 6/2009 |
| JP | 2011-017676 | 1/2011 |
| JP | 2011-141246 A | 7/2011 |
| JP | 2011-214958 A | 10/2011 |
| JP | 2011-214959 A | 10/2011 |

OTHER PUBLICATIONS

PCT/IB/346, "Notification Concerning the Filing of Amendments of the Claims for International Application No. PCT/JP2014/058130," dated Jul. 10, 2014.
PCT/ISA/210, "International Search Report for International Application No. PCT/JP2014/058130," dated Jun. 3, 2014.
Japan Patent Office, "Office Action for Japanese Patent Application No. 2013-064369," dated Jan. 17, 2017.
PCT/ISA/237, "Written Opinion of the International Searching Authority for International Application No. PCT/ JP2014/058130," dated Jun. 3, 2014.
Terai, K. et al., "Practical Optical Fiber Current Transformer for Gas Insulated Switchgear," 12th International Conference on Optical Fiber Sensors, Technical Digest, Oct. 28-31, 1997, OSA.
Willsch, M. et al., "Extention of the Measuring Range of Magneto Optic Current Sensors using Two Wavelengths Evaluation," 13th International Conference on Optical Fiber Sensors, Apr. 12-16, 1999, p. 366-369, vol. 3746, SPIE—The International Society of Optical Engineering.
Kurosawa, K. et al., "Development of Optical Current Transducer Using Flint Glass Fiber for Digital Substation System," 16th International Conference on Optical Fiber Sensors, Technical Digest, Oct. 13-17, 2003, p. 324-327, OFS-16.
Takahashi, M. et al., "Fiber-Optic Current Sensor Application to Power Distribution Equipment," Magnetics Japan, 2006, p. 118-122, vol. 1, No. 3, Magnetics Society of Japan.
Europe Patent Office, "Search Report for European Patent Application No. 14775266.1," dated Nov. 7, 2016.
Japan Patent Office, "Office Action for Japanese Patent Application No. 2013-064369," dated Aug. 2, 2016.

* cited by examiner

LIGHTNING CURRENT MEASURING DEVICE AND LIGHTNING CURRENT MEASURING METHOD

RELATED APPLICATIONS

The present application is National Phase of International Application No. PCT/JP2014/058130 filed Mar. 24, 2014, and claims priority from Japanese Application No. 2013-064369, filed Mar. 26, 2013, the disclosure of which is hereby incorporated by reference herein in its entirety.

TECHNICAL FIELD

The present invention relates to a lightning current measuring device and a lightning current measuring method.

BACKGROUND ART

Various kinds of crafts and buildings (for example, aircrafts, windmills, automobiles, and the like) may be struck by lightning. It is very important to measure a current (hereinafter, referred to as a "lightning current") generated by a lightning strike or a current distribution in anti-lightning design.

Figure 7:
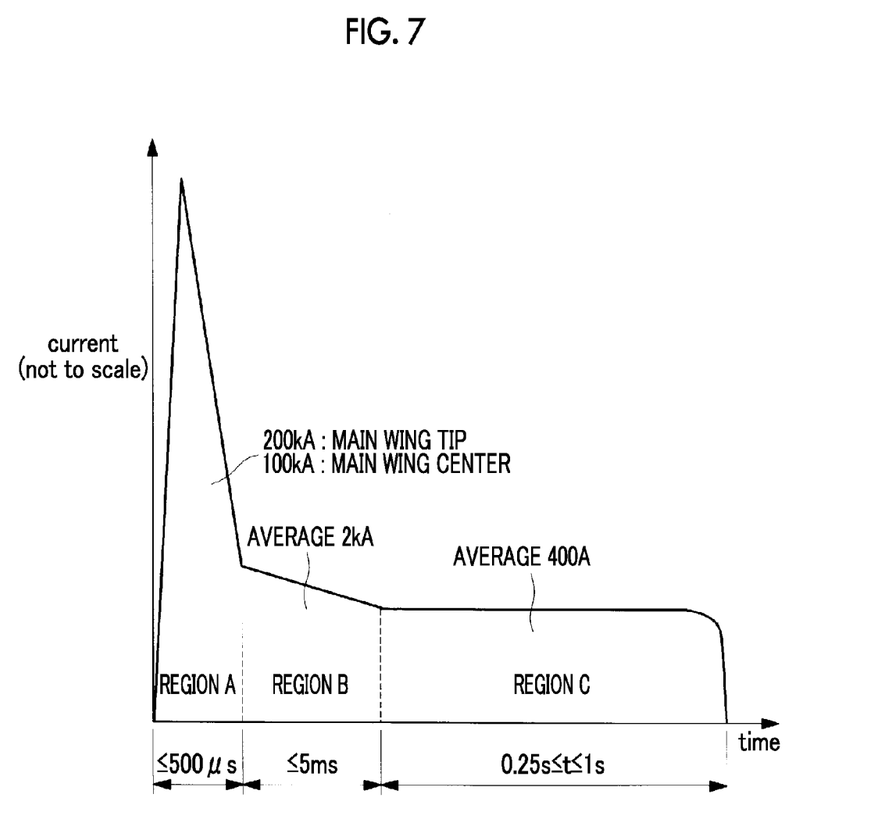
FIG. 7 is a diagram showing the magnitude of a lightning current.

For example, as specified in SAE standard ARP5412.revA (see FIG. 7), the lightning current includes a large current (a region A of FIG. 7) which has a maximum peak equal to or greater than 100 kA (about 200 kA at the tip of the main wing of an aircraft and about 100 kA at the center of the main wing) and a pulse waveform from the rise to 500 μsec, a current (a region B of FIG. 7) which is 2 kA on average and gradually decreases to about 5 msec, and a small current (a region C of FIG. 7) which is 400 A on average and is maintained at about 1 sec. In this way, the lightning current is a current waveform which has a short duration but has a high dynamic range and a wide time band, and there is demand for accurately measuring the current value for anti-lightning design.

As general means for measuring the lightning current, means for measuring an electromotive force at a loop end caused by a temporal change of a magnetic flux, such as a current transformer or a Rogowski coil, is known.

However, in the above-described means, since the electromotive force at the loop end caused by the temporal change of the magnetic flux is measured, a low-frequency component and a DC component cannot be measured. In a measurement using a Rogowski coil, since capacitive coupling occurs according to construction circumstances to an object struck by lightning, an error is superimposed on an original signal by lightning. In a measurement in a high voltage and high current field, such as a lightning current, insulation treatment or a noise countermeasure for measurement means is important but is not easily implemented. In the above-described measurement means, since the dimension of a sensor for measuring a current is large to be equal to greater than ten-odd mm to tens of mm, the shape of the sensor cannot be significantly changed, and it is difficult to measure a narrow strain portion of about several mm, it is difficult to evaluate the path of the lightning current in detail.

Accordingly, means for measuring a current using an optical fiber current sensor capable of measuring a narrow strain portion is known. The optical fiber current sensor measures a magnetic field caused by a current using a photomagnetic effect and obtains a current value. The optical fiber current sensor evaluates change in Faraday rotation angle due to a photomagnetic effect of fiber light to obtain a current value.

As an example of the optical fiber current sensor, a system which obtains change in optical phase difference in a circular optical path, called a Sagnac effect, to measure a DC component of a current has been developed.

PTL 1 discloses a lightning current measuring method which supplies measurement light to a photomagnetic field sensor provided in an object struck by lightning, changes the rotation angle of the plane of polarization of measurement light with change in magnetic field generated around a lightning current flowing through the object struck by lightning in the photomagnetic field sensor, substitutes the rotation angle of measurement light output from the photomagnetic field sensor to light intensity, and measures the light intensity to measure a lightning current.

PTL 2 discloses a fiber current sensor in which a polarized light separation element separates output light from a sensor fiber into two polarization components having orthogonal planes of polarization, the two separated polarization components are respectively converted to a first signal Px and a second signal Py through photoelectric conversion, and a signal processing unit multiplies the ratio Sx of a DC component and an AC component of the first signal Px and the ratio Sy of a DC component and an AC component of the second signal Py by different coefficients to calculate the difference value thereof.

CITATION LIST

Patent Literature

[PTL 1] Japanese Unexamined Patent Application Publication No. 7-43392
[PTL 2] Japanese Unexamined Patent Application Publication No. 2009-122095

SUMMARY OF INVENTION

Technical Problem

However, in the system using the Sagnac effect, only the DC component of the current can be detected. In the lightning current measuring method disclosed in PTL 1, a specific measurement method has not been described. In the fiber current sensor disclosed in PTL 2, since a current flowing through a conductor, such as an electric cable, is a current to be measured, and a measurement is performed for a commercial power supply without measuring a lightning current, it is not possible to measure a low frequency component which is a small current included in a lightning current, like in the region C of FIG. 7. Furthermore, since a current to be measured is an AC current, and the ratio of the DC component and the AC component is determined in order to reduce a ripple or the like of a light source in the signal processing unit, the DC component cannot be evaluated.

The invention has been accomplished in consideration of this situation, and an object of the invention is to provide a lightning current measuring device and a lightning current measuring method capable of measuring a lightning current of a DC component of a high dynamic range including a large current and a small current.

Solution to Problem

In order to solve the above-described problems, the lightning current measuring device and the lightning current measuring method of the invention employ the following means.

That is, a lightning current measuring device according to the present invention is provided with a sensor fiber, inputs linearly polarized light to the sensor fiber, and detects the magnitude of Faraday rotation applied to the linearly polarized light by a magnetic field due to a current to be measured flowing through a conductor provided around the sensor fiber to measure the current to be measured, and the lightning current measuring device includes: polarized light separation means for separating output light from the sensor fiber into a horizontal component and a vertical component having orthogonal planes of polarization; first calculation means for calculating a Faraday rotation angle through arc-sine processing of a digitized signal of the difference between the horizontal component and the vertical component converted to a signal through photoelectric conversion after separation by the change separation means; amplification means for amplifying the horizontal component and the vertical component converted to a signal through photoelectric conversion after separation by the change separation means; second calculation means for calculating a Faraday rotation angle based on a digitized signal of the difference between the horizontal component and the vertical component amplified by the amplification means; first conversion means for converting a current value from the Faraday rotation angle calculated by the first calculation means; and second conversion means for converting a current value from the Faraday rotation angle calculated by the second calculation means.

According to the invention, the lightning current measuring device is provided with the sensor fiber, linearly polarized light is input to the sensor fiber, and detects the magnitude of a Faraday rotation applied to linearly polarized light by the magnetic field due to the current to be measured flowing through the conductor around the sensor fiber to measure the current to be measured. With the use of the sensor fiber, the lightning current measuring device can measure a current even if the conductor through which the current to be measured flows is a thick conductor, has a complicated shape, is provided at a narrow place, or the like.

Then, the output light with the Faraday rotation angle changed by the magnetic field due to the current to be measured is separated into the horizontal component and the vertical component having orthogonal planes of polarization by the polarized light separation means.

The output light separated into the horizontal component and the vertical component is converted to signals through photoelectric conversion.

The lightning current which is the current to be measured is changed, for example, from 100 kA to 100 A, when the lightning current is small, the Faraday rotation angle is small, and when the lightning current is large, the Faraday rotation angle is large. In this way, since the lightning current has a large amount of fluctuation, a high dynamic range is required for the lightning current measuring device.

When the Faraday rotation angle is small, the difference between the horizontal component and the vertical component of the light intensity and the Faraday rotation angle are in a substantially proportional relationship, and when the Faraday rotation angle is large, the relationship of the difference between the horizontal component and the vertical component of the light intensity and the Faraday rotation angle is expressed by a sine function.

For this reason, the lightning current measuring device calculates the Faraday rotation angle through arc-sine processing of the digitized signal of the difference between the horizontal component and the vertical component of the light intensity by the first calculation means, and converts the current value from the Faraday rotation angle by the first conversion means, whereby it is possible to measure a large current included in a lightning current with excellent accuracy.

The lightning current measuring device amplifies the signals of the horizontal component and the vertical component of the light intensity by the amplification means, calculates the Faraday rotation angle based on the digitized signal of the difference between the horizontal component and the vertical component of the light intensity amplified by the second calculation means, and converts the current value from the Faraday rotation angle by the second conversion means, whereby it is possible to measure a small current included in a lightning current with excellent accuracy. In the second calculation means, the Faraday rotation angle may be calculated with the difference between the horizontal component and the vertical component of the light intensity and the Faraday rotation angle in the proportional relationship, or the Faraday rotation angle may be calculated with the relationship expressed by the sine function.

As described above, the lightning current measuring device performs processing corresponding to a large current and processing corresponding to a small current simultaneously, whereby it is possible to measure a lightning current of a DC component of a high dynamic range including a large current and a small current.

In addition, the lightning current measuring device according to the present invention may further include offset adjustment means for adjusting the offset of the horizontal component and the vertical component separated by the change separation means based on the amount of offset of the Faraday rotation angle in a state where the current to be measured is not measured, in which the second calculation means calculates the Faraday rotation angle based on the difference between the horizontal component and the vertical component amplified by the amplification means with the offset adjusted by the offset adjustment means.

According to the invention, the offset of the signal input to the second calculation means for calculating a Faraday rotation angle according to a small current is adjusted, whereby it is possible to remove the influence of temperature dependence of the Faraday rotation or a ripple component of a light source and to measure a small current included in a lightning current with excellent accuracy.

In addition, the lightning current measuring device according to the present invention may further include discount means for discounting signals of the horizontal component and the vertical component amplified by the amplification means with the offset adjusted by the offset adjustment means with an amplification factor of the amplification means in the process of converting the signal from an analog signal to a digital signal, in which the second calculation means calculates the Faraday rotation angle based on the difference between the horizontal component and the vertical component discounted by the discount means.

According to the invention, the amplified signals are discounted with the amplification factor used for amplification in the process of converting an analog signal according to a small current to a digital signal, whereby it is possible to reduce quantization errors.

In addition, in the lightning current measuring device according to the present invention, a signal representing the horizontal component and a signal representing the vertical component input to the first calculation means may be converted from analog signals to digital signals at a first sampling frequency, a signal representing the horizontal component and a signal representing the vertical component input to the second calculation means may be converted from analog signals to digital signals at a second sampling frequency, and the first sampling frequency may be faster than the second sampling frequency.

The lightning current includes a pulsed large current and a small current which is maintained for a longer time than the large current. That is, the large current has a high frequency and the small current has a lower frequency than the large current.

Therefore, according to the invention, the first sampling frequency for converting the signals input to the first calculation means for calculating the Faraday rotation angle according to the large current to a digital signal is faster than the second sampling frequency for converting the signals input to the second calculation means for calculating the Faraday rotation angle according to the small current. With this, the invention can perform a measurement with higher accuracy according to a large current and a small current included in a lightning current.

In addition, the lightning current measuring device according to the present invention may further include combination means for combining the waveform of the current converted by the first conversion means and the waveform of the current converted by the second conversion means based on a threshold value determined in advance.

According to the invention, the waveform of the current converted by the first conversion means and the waveform of the current converted by the second conversion means are combined based on the threshold value determined in advance, whereby a waveform from a high frequency domain to a low frequency domain of a lightning current can be simply generated.

On the other hand, a lightning current measuring method according to the present invention inputs linearly polarized light to a sensor fiber and detects the magnitude of Faraday rotation applied to the linearly polarized light by a magnetic field due to a current to be measured flowing through a conductor provided around the sensor fiber to measure the current to be measured, and the lightning current measuring method includes: a first step of separating output light from the sensor fiber into a horizontal component and a vertical component having orthogonal planes of polarization; a second step of calculating a Faraday rotation angle through arc-sine processing of a digitized signal of the difference between the horizontal component and the vertical component converted to a signal through photoelectric conversion after separation in the first step and calculating a Faraday rotation angle based on a digitized signal of the difference between the horizontal component and the vertical component converted to signals through the photoelectric conversion after separation in the first step and amplified; and a third step of converting current values from the Faraday rotation angles calculated in the second step.

Advantageous Effects of Invention

The invention has an excellent effect capable of measuring a lightning current of a DC component of a high dynamic range including a large current and a small current.

DESCRIPTION OF EMBODIMENTS

Hereinafter, an embodiment of a lightning current measuring device and a lightning current measuring method according to the invention will be described referring to the drawings.

Figure 1:
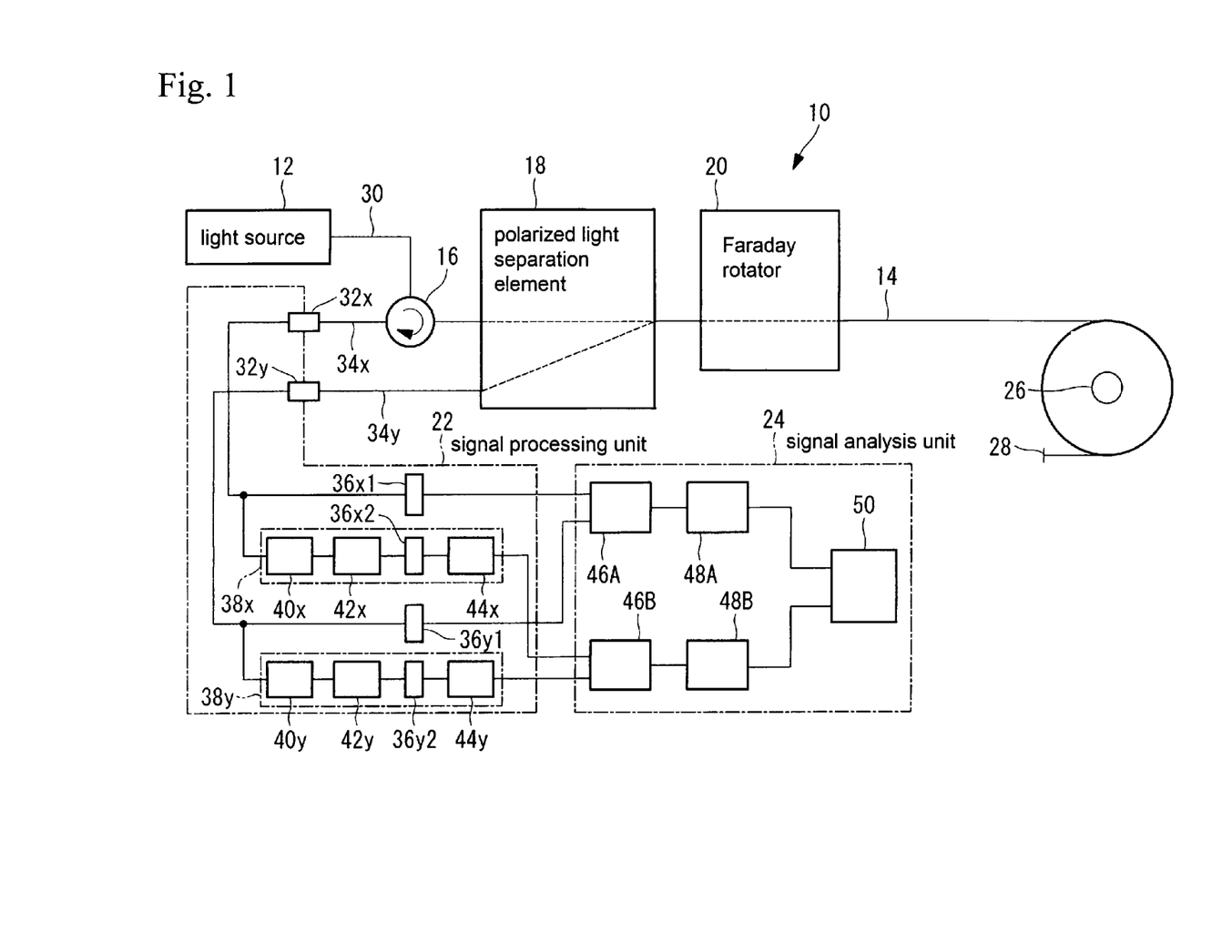
FIG. 1 is a configuration diagram of a lightning current measuring device according to an embodiment of the invention.

FIG. 1 is a configuration diagram of a lightning current measuring device 10 according to this embodiment.

As shown in FIG. 1, the lightning current measuring device 10 includes a light source 12, a sensor fiber 14, optical circulator 16, a polarized light separation element 18, a Faraday rotator 20, a signal processing unit 22, and a signal analysis unit 24.

The sensor fiber 14 is arranged so as to revolve around a conductor 26 through which a current to be measured flows. As the sensor fiber 14, preferably, a lead-doped lead glass fiber which is an optical fiber having a characteristic of a large Verdet constant for determining the magnitude of a Faraday effect can be used. As the conductor 26, for example, the main wing of an aircraft is used. With the use of the flexible sensor fiber 14, it is possible to measure a current even if the conductor through which the current to be measured flows is a thick conductor, has a complicated shape, is provided at a narrow place (for example, a narrow strain portion of equal to or less than several mm), or the like.

The Faraday rotator 20 is attached to one end of the sensor fiber 14, and a reflection part (mirror) 28 is formed of a thin metal film by vapor deposition or the like at the other end of the sensor fiber 14. The Faraday rotator 20 and the polarized light separation element 18, and the polarized light separation element 18 and the optical circulator 16 are connected by optical fibers, and the optical circulator 16 is connected in a direction in which light supplied from the light source 12 through a light transmission fiber 30 is transmitted toward the sensor fiber 14.

The signal processing unit 22 has two light receiving elements 32x and 32y as an input unit, the one light receiving element 32x is connected to a terminal from which transmitted light from the sensor fiber 14 of the optical circulator 16 is output by a light receiver fiber 34x, and the other light receiving element 32y is connected to the polarized light separation element 18 by a light receiver fiber 34y.

Light emitted from the light source 12 enters the polarized light separation element 18 through the light transmission fiber 30 and the optical circulator 16. Light is converted to linearly polarized light in which the vibration direction of an electric field is aligned in one direction (the principal axis direction of the polarized light separation element 18) by the polarized light separation element 18, and is input to the Faraday rotator 20. The Faraday rotator 20 is made of a permanent magnet and a ferromagnetic garnet which is ferromagnetic crystal magnetically saturated by the permanent magnet, and applies a Faraday rotation of 22.5 degrees in a single unidirectional trip to light transmitted through the ferromagnetic garnet. Linearly polarized light emitted from the Faraday rotator 20 is input to the sensor fiber 14 and is subjected to the Faraday rotation by a magnetic field generated around the current to be measured flowing through the conductor 26 in the revolving portion of the sensor fiber 14, and the plane of polarization thereof rotates at a Faraday rotation angle proportional to the magnitude of the magnetic field.

Figure 2:
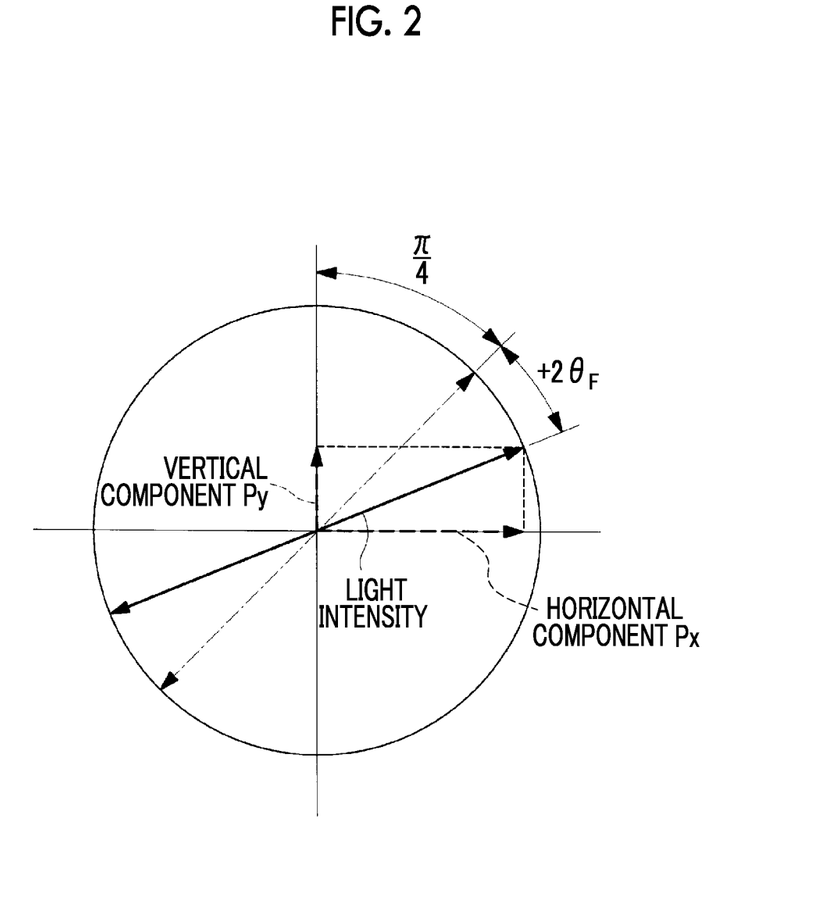
FIG. 2 is a diagram showing a horizontal component Px and a vertical component Py of light intensity.

Light propagating through the sensor fiber 14 is further reflected by the reflection part 28, passes through the revolving portion again, is subjected to the Faraday rotation, and is input to the Faraday rotator 20. The Faraday rotation of 22.5 degrees is further applied when light passes through the Faraday rotator 20 again, whereby the Faraday rotation of a total of 45 degrees in a round trip is applied by the Faraday rotator 20. That is, in the lightning current measuring device 10, an optical bias is set to 45 degrees. Light passing through the Faraday rotator 20 is guided again into the polarized light separation element 18 and separated into a horizontal component and a vertical component (see FIG. 2) which are two polarization components having orthogonal polarization directions (the principal axis direction of the polarized light separation element 18 and the direction perpendicular thereto).

Light of the separated horizontal component is received by the light receiving element 32x through the optical circulator 16 and the light receiver fiber 34x and is converted to a signal Px (analog signal) proportional to the light intensity of the horizontal component through photoelectric conversion. Light of the vertical component is received by the light receiving element 32y through the light receiver fiber 34y and is converted to a signal Py (analog signal) proportional to the light intensity of the vertical component through photoelectric conversion.

The signal processing unit 22 includes A/D converters 36x1 and 36y1 which convert an analog signal to a digital signal, and small current processing units 38x and 38y.

The signal Px output from the light receiving element 32x is input to the A/D converter 36x1 and the small current processing unit 38x. The small current processing unit 38x includes an offset unit 40x, an amplifier 42x, an A/D converter 36x2, and a discount unit 44x.

The A/D converter 36x1 converts the signal Px from an analog signal to a digital signal at a first sampling frequency. The signal Px converted to a digital signal by the A/D converter 36x1 is input a Faraday rotation angle calculation unit 46A in the signal analysis unit 24.

The signal Px input to the small current processing unit 38x is subjected to the small current processing described below in detail, is converted from an analog signal to a digital signal at a second sampling frequency by the A/D converter 36x2, and is then input to a Faraday rotation angle calculation unit 46B in the signal analysis unit 24.

The signal Py output from the light receiving element 32y is input to the A/D converter 36y1 and the small current processing unit 38y. The small current processing unit 38y includes an offset unit 40y, an amplifier 42y, an A/D converter 36y2, and a discount unit 44y.

The A/D converter 36y1 converts the signal Py from an analog signal to a digital signal at the first sampling frequency. The signal Py converted to a digital signal by the A/D converter 36y1 is input to the Faraday rotation angle calculation unit 46A in the signal analysis unit 24.

The signal Py input to the small current processing unit 38y is subjected to small current processing described below, is converted from an analog signal to a digital signal at the second sampling frequency by the A/D converter 36y2, and is then input to the Faraday rotation angle calculation unit 46B in the signal analysis unit 24.

The Faraday rotation angle calculation unit 46A calculates a Faraday rotation angle through arc-sine processing of the difference between the horizontal component of the light intensity represented by the signal Px and the vertical component of the light intensity represented by the signal Py. A current value conversion unit 48A converts a current value from the Faraday rotation angle calculated by the Faraday rotation angle calculation unit 46A.

The Faraday rotation angle calculation unit 46B calculates a Faraday rotation angle based on the difference between the horizontal component of the light intensity represented by the signal Px subjected to the small current processing and the vertical component of the light intensity represented by the signal Py subjected to the small current processing. A current value conversion unit 48B converts a current value from the Faraday rotation angle calculated by the Faraday rotation angle calculation unit 46B.

A waveform combination unit 50 in the signal analysis unit 24 combines the waveform of the current converted by the current value conversion unit 48A and the waveform of the current converted by the current value conversion unit 48B based on a threshold value determined in advance.

Next, the operation of the lightning current measuring device 10 will be described.

The measurement by the lightning current measuring device 10 is triggered, for example, when an external magnetic field which occurs with the generation of actual lightning is detected, or the timing of discharging by simulating lightning when lightning is generated through an experiment.

A lightning current which is a current to be measured is changed, for example, from 100 kA to 100 A, when the lightning current is small, the Faraday rotation angle is small, and when the lightning current is large, the Faraday rotation angle is large.

Figure 3:
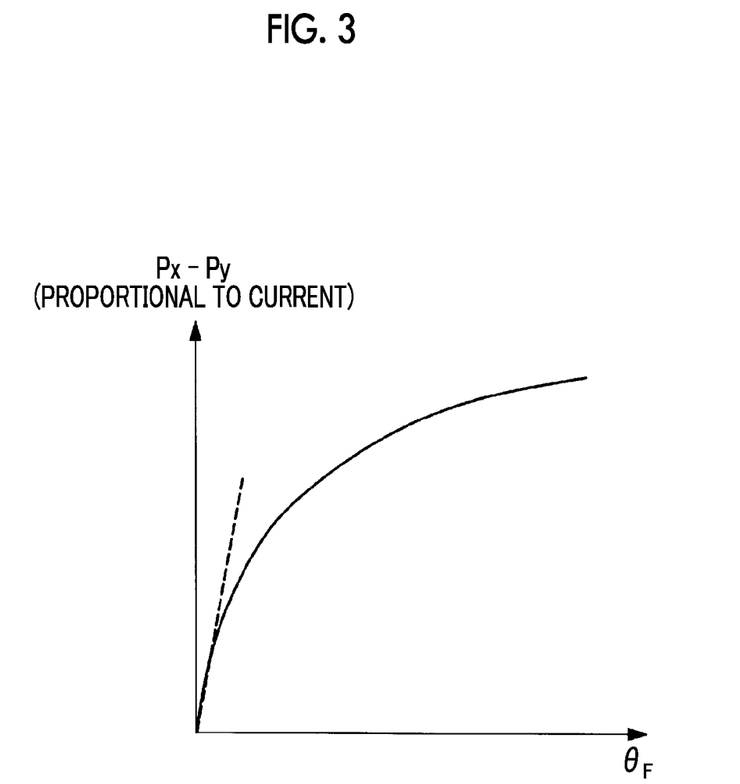
FIG. 3 is a diagram showing the relationship of the difference between the horizontal component Px and the vertical component Py of the light intensity and a Faraday rotation angle.

As shown in FIG. 3, when the Faraday rotation angle is small, the difference between the horizontal component and the vertical component of the light intensity and the Faraday rotation angle are in a substantially proportional relationship (broken line), and when the Faraday rotation angle is large, the relationship of the difference between the horizontal component and the vertical component of the light intensity and the Faraday rotation angle is expressed by a sine function (solid line).

That is, when measuring a large current included in a lightning current, it is preferable to obtain a current value through the arc-sine processing of the difference between the horizontal component and the vertical component of the light intensity.

Specifically, if an electric field is E and the Faraday rotation angle is $\theta_F$, the light intensity of the horizontal component represented by the signal Px is expressed by Expression (1) described below, and the light intensity of the vertical component represented by the signal Py is expressed by Expression (2) described below. The difference S between the horizontal component and the vertical component of the light intensity is expressed by Expression (3) described below.

$$S_x = E^2 \cos^2\left(\frac{\pi}{4} - 2\theta_F\right) \quad (1)$$

$$S_y = E^2 \sin^2\left(\frac{\pi}{4} - 2\theta_F\right) \quad (2)$$

$$S = S_x - S_y = E^2 \sin 4\theta_F \quad (3)$$

The Faraday rotation angle $\theta_F$ is expressed by Expression (4) described below based on Expression (3).

$$\theta_F = \frac{1}{4} \operatorname{Arcsin}^2\left(\frac{S}{E^2}\right) \quad (4)$$

A lightning current I is expressed by Expression (5) using the Faraday rotation angle $\theta_F$.

$$I = \frac{I_o}{\pi/2} \cdot \theta_F \quad (5)$$

In Expression (5), $I_O$ is a current which becomes a reference at a predetermined Faraday rotation angle, and is specified by the property of the optical fiber. For example, in a lead-doped optical fiber, when the Faraday rotation angle is 45°, the current value becomes 100 kA.

In this way, the lightning current measuring device 10 calculates the Faraday rotation angle through the arc-sine processing of the difference between the horizontal component and the vertical component using Expressions (1) to (4) by the Faraday rotation angle calculation unit 46A, and converts the current value from the calculated Faraday rotation angle by the current value conversion unit 48A, whereby it is possible to measure a large current in a lightning current with excellent accuracy.

Next, small current processing which is performed in order to measure a small current included in a lightning current with excellent accuracy will be described referring to FIGS. 4 and 5.

Figure 4:
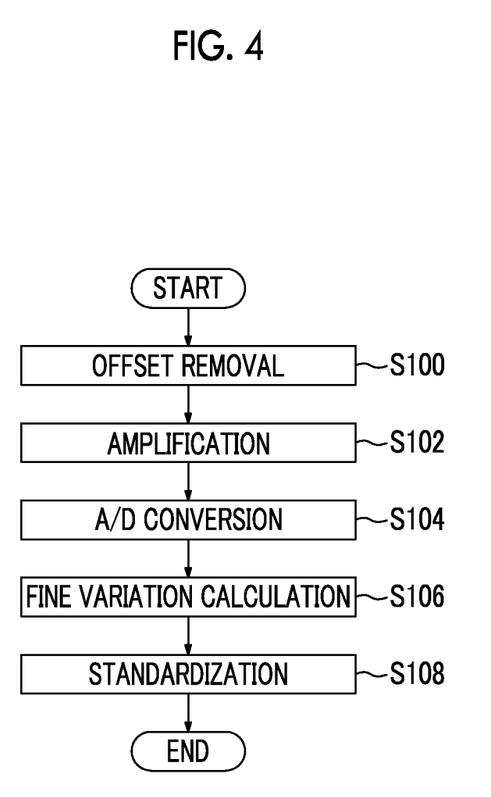
FIG. 4 is a flowchart showing the flow of small current processing according to this embodiment.

FIG. 4 is a flowchart showing the flow of the small current processing according to this embodiment, and the small current processing which is performed in each of the small current processing units 38x and 38y is the same. FIG. 5 is a diagram showing changes of the signals Px and Py due to the small current processing.

Figure 5A:
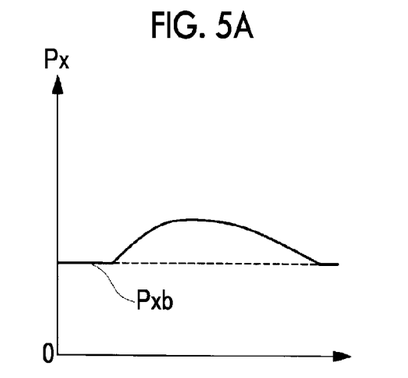
FIG. 5 is a diagram showing changes of signals Px and Py due to the small current processing according to this embodiment.
Figure 5B:
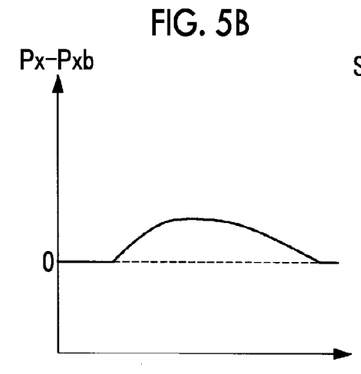

If the signal Px is input to the small current processing unit 38x, first, in Step 100, a Px baseline (Pxb) which becomes the amount of offset is subtracted from the signal Px by the offset unit 40x, thereby removing the offset of the signal Px (FIG. 5(b)). As shown in FIG. 5(a), the Px baseline is a reference level before a lightning current is generated. With this, it is possible to remove temperature dependence of the Faraday rotator 20, a ripple component of the light source 12, or the like.

Figure 5C:
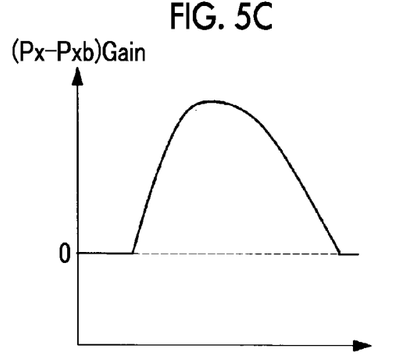

Next, in Step 102, the signal Px with the offset removed is amplified with a predetermined amplification factor Gain by the amplifier 42x as shown in Expression (6) described below and becomes a signal Fx (FIG. 5(c)). As the amplifiers 42x and 42y, an amplifier having a wide amplifiable band (0.1 Hz to several 10 MHz) is used.

$$Fx = (Px - Pxb) \cdot \text{Gain} \quad (6)$$

Next, in Step 104, the signal Fx is converted from an analog signal to a digital signal by the A/D converter 36x2.

Figure 5D:
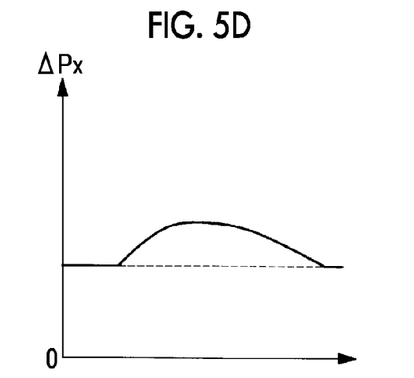

Next, in Step 106, as shown in Expression (7) described below, the signal Fx which has become a digital signal is discounted by the discount unit 44x by dividing the signal Fx by the amplification factor Gain and adding the Px baseline Pxb to calculate a fine variation Px' (FIG. 5(d)).

$$Px' = Pxb + \frac{Fx}{\text{Gain}} \quad (7)$$

In this way, in the process of converting an analog signal according to a small current to a digital signal, the small current processing amplifies the analog signal according to the small current, converts the amplified analog signal to a digital signal, and then discounts the digital signal with the amplification factor used for amplification, whereby it is possible to reduce quantization errors.

Figure 5E:
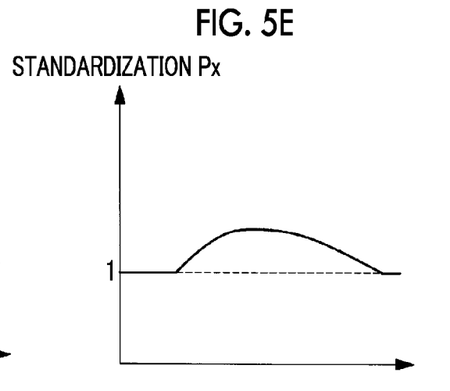

Next, in Step 108, as shown in Expression (8) described below, the calculated fine variation Px' is standardized by the discount unit 44x by dividing the fine variation Px' by the Px baseline Pxb (FIG. 5(e)), the signal Px after standardization is output to the Faraday rotation angle calculation unit 46B, and the small current processing ends.

$$Px = \frac{Px'}{Pxb} \quad (8)$$

With the standardization shown in Expression (8), when an initial state where a lightning current is not generated is "1", it is possible to clarify to what extent the Faraday rotation angle is changed.

The small current processing for the signal Py is the same as the small current processing for the signal Px, a Py baseline (Pyb) which becomes the amount of offset is subtracted from the signal Py by the offset unit 40y, and then, the signal Py is amplified with a predetermined amplification factor by the amplifier 42y. The small current processing for the signal Py performs A/D conversion by the A/D converter 36y2, then calculates a fine variation Py' by the discount unit 44y, and outputs the signal Py standardized by dividing the fine variation Py' by the Py baseline Pyb to the Faraday rotation angle calculation unit 46B.

The above-described small current processing is performed on the signals Px and Py, whereby it is also possible to measure a Faraday rotation angle of a small current with a small amount of displacement of the Faraday rotation angle.

The lightning current measuring device 10 calculates the Faraday rotation angle based on the difference between the horizontal component and the vertical component of the light intensity subjected to the small current processing by the Faraday rotation angle calculation unit 46B, and converts the current value from the Faraday rotation angle by the current value conversion unit 48B, whereby it is possible to measure a small current included in a lightning current with excellent accuracy.

In the Faraday rotation angle calculation unit 46B, the Faraday rotation angle may be calculated with the difference between the horizontal component and the vertical component of the light intensity and the Faraday rotation angle in the proportional relationship, or the Faraday rotation angle may be calculated with the relationship expressed by the sine function.

When calculating the Faraday rotation angle with the proportional relationship, the Faraday rotation angle is calculated by multiplying the difference between the horizontal component and the vertical component of the light intensity by a predetermined coefficient. When calculating the Faraday rotation angle with the relationship expressed by the sine function, the Faraday rotation angle is calculated using Expressions (1) to (4).

As described above, a lightning current includes a pulsed large current, and a small current which is maintained for a longer time than the large current. That is, the large current has a high frequency, and the small current has a low frequency.

Accordingly, the lightning current measuring device 10 makes the first sampling frequency for digitizing the input input to the Faraday rotation angle calculation unit 46A corresponding to the large current faster than the second sampling frequency for digitizing the signal input to the Faraday rotation angle calculation unit 46B corresponding to the small current. That is, the first sampling frequency of the A/D converters 36$x$1 and 36$y$1 is faster than the second sampling frequency of the A/D converters 36$x$2 and 36$y$2, and requested time resolution for measuring the large current at the high frequency is satisfied.

With this, the lightning current measuring device 10 can perform a measurement with higher accuracy according to a large current and a small current included in a lightning current.

The waveform of the current converted by the current value conversion unit 48A and the waveform of the current converted by the current value conversion unit 48B are combined based on the threshold value determined in advance by the waveform combination unit 50.

Since the waveform of the current converted by the current value conversion unit 48A is the waveform obtained by the processing according to the large current included in the lightning current, accuracy of the waveform corresponding to the small current in the waveform of the current converted by the current value conversion unit 48A is not higher than accuracy of the waveform corresponding to the large current. Since the waveform of the current converted by the current value conversion unit 48B is the waveform obtained by the processing according to the small current included in the lightning current, accuracy of the waveform corresponding to the large current in the waveform of the current converted by the current value conversion unit 48B is not higher than accuracy of the waveform corresponding to the small current.

For this reason, the waveform of the current converted by the current value conversion unit 48A and the waveform of the current converted by the current value conversion unit 48B are combined based on the threshold value determined in advance, whereby a waveform from a high frequency domain to a low frequency domain of a lightning current can be simply generated.

The threshold value determined in advance is determined by, for example, a current value or a time, specifically, a current value (for example, 1 kA) between the large current and the small current, a time (for example, 5 msec) between the large current and the small current, or the like.

As described above, the lightning current measuring device 10 according to this embodiment includes the polarized light separation element 18 which separates output from the sensor fiber 14 into the horizontal component and the vertical component having orthogonal planes of polarization, the Faraday rotation angle calculation unit 46A which calculates the Faraday rotation angle through the arc-sine processing of the digitized signal of the difference between the horizontal component and the vertical component converted to a signal through the photoelectric conversion after separation by the polarized light separation element 18, the amplifiers 42$x$ and 42$y$ which amplify the horizontal component and the vertical component converted to a signal through the photoelectric conversion after separation by the polarized light separation element 18, the Faraday rotation angle calculation unit 46B which calculates the Faraday rotation angle based on the digitized signal of the difference between the horizontal component and the vertical component amplified by the amplifiers 42$x$ and 42$y$, the current value conversion unit 48A which converts the current value from the Faraday rotation angle calculated by the Faraday rotation angle calculation unit 46A, and the current value conversion unit 48B which converts the current value from the Faraday rotation angle calculated by the Faraday rotation angle calculation unit 46B.

Accordingly, the lightning current measuring device 10 performs processing corresponding to a large current and processing corresponding to a small current simultaneously, whereby it is possible to measure a lightning current of a DC component of a high dynamic range including a large current and a small current.

Table 1 described below shows the comparison of an existing current measuring device and the lightning current measuring device 10 according to this embodiment.

TABLE 1

| | Lightning Current Measurement | | | | |
|---|---|---|---|---|---|
| Current Measuring Device | High-Speed Rise (1 μsec) Large Current (100 kA) | Current Continued (1 sec) Small current (400 A) | Measurement of Narrow Place or Thick Conductor | Electromagnetic Noise | Electric Insulation |
| Rogowski Coil | A | C | C | C | C |
| Current Transformer | A | C | C | C | C |
| Existing Optical Fiber Current Sensor (1) (Lead Glass Fiber Sensor, Light Intensity Detection, | B | B | A | A | A |

TABLE 1-continued

| | Lightning Current Measurement | | | | |
|---|---|---|---|---|---|
| Current Measuring Device | High-Speed Rise (1 μsec) Large Current (100 kA) | Current Continued (1 sec) Small current (400 A) | Measurement of Narrow Place or Thick Conductor | Electromagnetic Noise | Electric Insulation |
| Use for AC, Analog Processing) | | | | | |
| Existing Optical Fiber Current Sensor (2) (Quartz Glass Fiber Sensor, Sagnac Interferometer, Use for DC + AC, Digital Processing) | C | A | C | A | A |
| Lightning Current Measuring Device according to this Embodiment | A | A | A | A | A |

As shown in Table 1, in each existing current measuring device, when a measurement of a lightning current is intended, there are unsuitable items; however, the lightning current measuring device 10 according to this embodiment satisfies each item and is suitable for a measurement of a lightning current.

Modification Example

Figure 6:
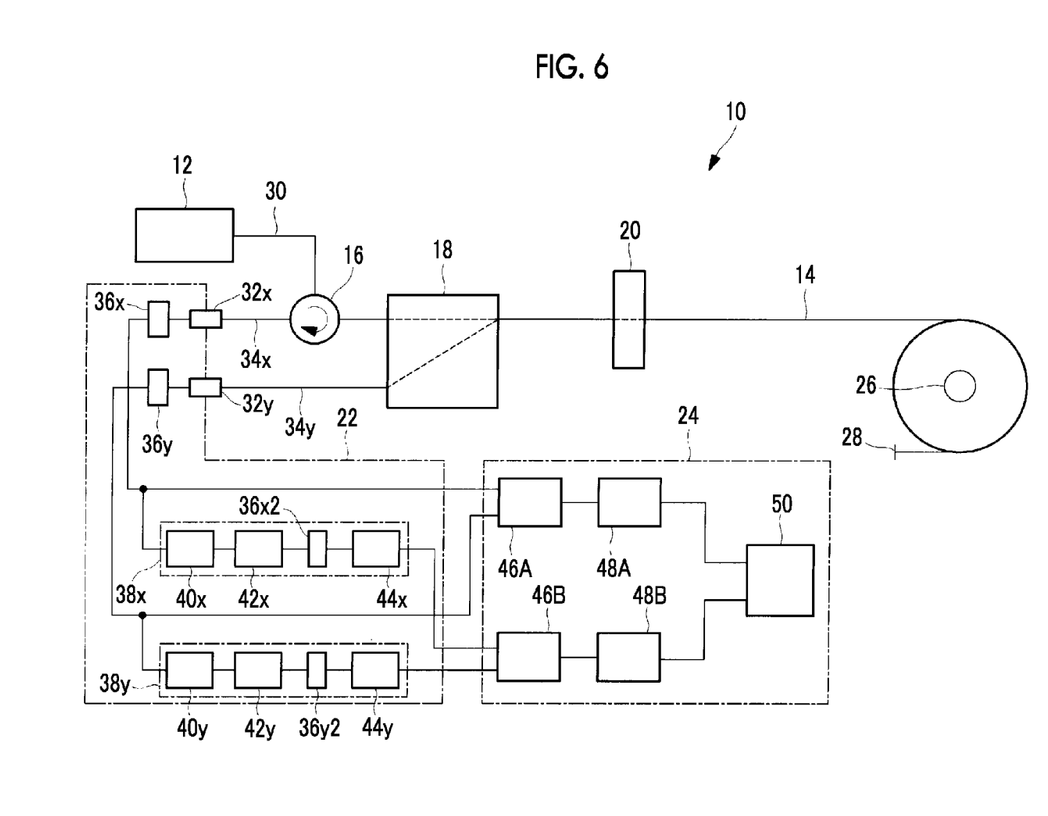
FIG. 6 is a configuration diagram of a lightning current measuring device according to a modification example.

FIG. 6 shows a modification example of the lightning current measuring device 10.

As shown in FIG. 6, the lightning current measuring device 10 includes A/D converters 36x and 36y on the downstream side of the light receiving elements 32x and 32y. Accordingly, the configuration of the lightning current measuring device 10 is further simplified.

The lightning current measuring device 10 may perform the same processing as the offset removal performed in the small current processing units 38x and 38y for the signals Px and Py input to the Faraday rotation angle calculation unit 46A, that is, signals corresponding to the large current.

Although the invention has been described based on the above-described embodiment, the technical scope of the invention is not limited to the scope of description in the above-described embodiment. Various changes or improvements can be made to the above-described embodiment without departing from the spirit and scope of the invention, and embodiments including the changes or the improvements still fall within the technical scope of the invention.

For example, in the above-described embodiment, although a form in which the conductor 26 is an aircraft has been described, the invention is not limited thereto, and a form in which an automobile, a wind power generation device, a cable, a building, or the like is used as the conductor 26 may be made.

REFERENCE SIGNS LIST

10: lightning current measuring device
14: sensor fiber
18: polarized light separation element
26: conductor
36x1: A/D converter
36x2: A/D converter
36y1: A/D converter
36y2: A/D converter
40x: offset unit
40y: offset unit
42x: amplifier
42y: amplifier
46A: Faraday rotation angle calculation unit
46B: Faraday rotation angle calculation unit
48A: current value conversion unit
48B: current value conversion unit

The invention claimed is:

1. A lightning current measuring device which is provided with a sensor fiber, inputs linearly polarized light to the sensor fiber, and detects magnitude of Faraday rotation applied to the linearly polarized light by a magnetic field due to a current to be measured flowing through a conductor provided around the sensor fiber to measure the current to be measured, the lightning current measuring device comprising:
   polarized light separation means for separating output light from the sensor fiber into a horizontal component and a vertical component having orthogonal planes of polarization;
   first calculation means for calculating a Faraday rotation angle through arc-sine processing of a digitized signal of difference between a horizontal component signal and a vertical component signal converted from the horizontal component and the vertical component through photoelectric conversion after separation by the polarized light separation means;
   amplification means for amplifying the horizontal component signal and the vertical component signal converted through the photoelectric conversion after the separation by the polarized light separation means;
   second calculation means for calculating a Faraday rotation angle based on a digitized signal of difference between the horizontal component signal and the vertical component signal amplified by the amplification means;
   first conversion means for converting a current value from the Faraday rotation angle calculated by the first calculation means;
   second conversion means for converting a current value from the Faraday rotation angle calculated by the second calculation means; and
   offset adjustment means for adjusting an offset of the horizontal component signal and the vertical component signal converted from the horizontal component and the vertical component separated by the polarized light separation means based on an amount of offset by setting, as the amount of the offset, a reference level of the horizontal component signal and the vertical component signal in the Faraday rotation angle in a state where the current to be measured does not flow, wherein the second calculation means calculates the Faraday rotation angle based on the difference between the horizontal component signal and the vertical component signal amplified by the amplification means with the offset adjusted by the offset adjustment means.

2. The lightning current measuring device according to claim 1, further comprising:

discount means for discounting the horizontal component signal and the vertical component signal being converted from analog to digital, amplified by the amplification means with the offset adjusted by the offset adjustment means with an amplification factor of the amplification means, wherein the second calculation means calculates the Faraday rotation angle based on difference between the horizontal component signal and the vertical component signal discounted by the discount means.

3. The lightning current measuring device according to claim 1, wherein a signal representing the horizontal component and a signal representing the vertical component input to the first calculation means are converted from analog signals to digital signals at a first sampling frequency, a signal representing the horizontal component and a signal representing the vertical component input to the second calculation means are converted from analog signals to digital signals at a second sampling frequency, and the first sampling frequency is faster than the second sampling frequency.

4. The lightning current measuring device according to claim 1, further comprising:

combination means for combining waveform of the current converted by the first conversion means and waveform of the current converted by the second conversion means based on a threshold value determined in advance.

* * * * *